United States Patent
Rättö

(10) Patent No.: US 6,993,091 B2
(45) Date of Patent: Jan. 31, 2006

(54) CORRECTION OF DC-OFFSET OF I/Q MODULATOR

(75) Inventor: Mika Rättö, Espoo (FI)

(73) Assignee: Nokia Networks Oy, Espoo (FI)

(*) Notice: Subject to any disclaimer, the term of this patent is extended or adjusted under 35 U.S.C. 154(b) by 337 days.

(21) Appl. No.: 09/962,585

(22) Filed: Sep. 26, 2001

(65) Prior Publication Data

US 2002/0018531 A1 Feb. 14, 2002

Related U.S. Application Data

(63) Continuation of application No. PCT/FI00/00245, filed on Mar. 24, 2000.

(30) Foreign Application Priority Data

Mar. 26, 1999 (FI) .................................. 990679

(51) Int. Cl.
*H04K 1/02* (2006.01)
*H04L 25/06* (2006.01)
*H04B 1/16* (2006.01)

(52) U.S. Cl. .................. 375/297; 375/319; 458/216
(58) Field of Classification Search ........ 375/296–319, 375/279; 332/103, 123–159; 455/126, 216
See application file for complete search history.

(56) References Cited

U.S. PATENT DOCUMENTS

| 24,398 A | * | 6/1859 | Lagerblom et al. ......... 332/103 |
|---|---|---|---|
| 5,054,037 A | * | 10/1991 | Martineau et al. .......... 375/296 |
| 5,351,016 A | | 9/1994 | Dent |
| 5,381,108 A | | 1/1995 | Whitmarsh et al. |
| 5,442,655 A | | 8/1995 | Dedic et al. |
| 5,793,817 A | | 8/1998 | Wilson |
| 5,847,619 A | * | 12/1998 | Kirisawa ..................... 332/103 |
| 5,960,040 A | * | 9/1999 | Cai et al. ..................... 375/279 |
| 6,081,698 A | * | 6/2000 | Moriyama et al. .......... 455/126 |
| 6,570,933 B1 | | 5/2003 | Makinen |

FOREIGN PATENT DOCUMENTS

| EP | 608 577 | 8/1994 |
|---|---|---|
| WO | WO 98/24209 | 6/1998 |
| WO | WO 9824209 A1 * | 6/1998 |
| WO | WO 99/13590 | 3/1999 |

* cited by examiner

*Primary Examiner*—Stephen Chin
*Assistant Examiner*—Cicely Ware
(74) *Attorney, Agent, or Firm*—Pillsbury Winthrop Shaw Pittman LLP

(57) ABSTRACT

A method and an arrangement for determining correction parameters used for correcting DC-offset of an I/Q modulator in a transmitter comprising an I/Q modulator and a corrector for correcting the DC-offset caused by the I/Q modulator are presented. The method comprises sampling the I/Q-modulated test signals, which are formed from I/Q-plane test vectors, A/D-converting the signal samples taken from the test signals, I/Q-demodulating the signal samples digitally into I- and Q-feedback signals, determining the DC-offset caused by the I/Q modulator on the basis of the test vectors and the feedback vectors caused by the test vectors and formed from the I- and Q-feedback signals, and determining the correction parameters of DC-offset on the basis of the determined DC-offset.

14 Claims, 2 Drawing Sheets

CORRECTION OF DC-OFFSET OF I/Q MODULATOR

This is a Continuation Application of International Application No. PCT/FI00/00245 which was filed on Mar. 24, 2000 in the English language.

BACKGROUND OF THE INVENTION

The invention relates to correction of DC-offset caused by an I/Q modulator in a transmitter.

In new radio systems, the scarcity of radio frequencies makes it necessary to use spectrum-efficient modulation methods. In Europe, a new radio system standard has been developed for PMR (Professional Mobile Radio) users, called TETRA (Terrestrial Trunked Radio). $\pi/4$-DQPSK ($\pi/4$-shifted Differential Quadrature Phase Shift Keying) has been selected as the modulation method of the system. As far as a transmitter is concerned, a drawback to the modulation method is the variation in the amplitude of the envelope of a radio frequency signal, which causes InterModulation (IM) in a nonlinear amplifier. The IM results spread the spectrum of a transmitted signal and thus tend to reduce the gain obtained from using the linear modulation method. The IM results cannot usually be filtered since they are formed extremely close to the desired signal. With constant-amplitude modulation methods, no spreading of the spectrum occurs; therefore, the signal can be amplified by a nonlinear amplifier.

A trunked PMR system, wherein different user groups share the same radio channels, has stringent requirements regarding adjacent channel interference caused by a transmitter. These requirements necessitate good linearity in the transmitter of the radio system used.

In a power amplifier, good linearity is only achieved with poor efficiency. However, the efficiency of portable equipment should be as high as possible for the operation time to be sufficient and in order not to waste battery capacity. In addition, at least relatively good efficiency is required of power amplifiers at base stations in order to avoid cooling problems. Sufficient efficiency and linearity can only be achieved by linearizing the transmitter.

If the nonlinearities of an amplifier were known in advance, it would be possible to form inverse functions of the nonlinearities to convert the input signal, whereby the nonlinearities would be cancelled. The characteristics of the amplifier do not, however, stay the same but they change due to, for example, aging, warming up, and according to the radio channel and power level used. In addition, amplifiers have individual differences. Linearization methods are needed that are capable of adjusting adaptively to changing conditions. Research has been conducted on many different linearization methods, and three have been found to possess characteristics suitable for practical radio systems. These methods are feedforward, Cartesian feedback and predistortion. A linearization method can also be adaptive.

Thus, if the nonlinear transfer function of the amplifier is known and if it does not vary as a function of time, the signal to be transmitted can be linearized by applying to the signal a suitable transfer function causing predistortion. Hence, the signal outputted from the amplifier can be made linear. This method is called predistortion. At baseband, for example, predistortion can be carried out by using a lookup table (LUT) into which are stored conversion parameters causing predistortion, i.e. predistortion parameters, in which case the conversion parameters to be used at a given time are selected on the basis of the amplitude of the signal to be predistorted.

In a signal measured from the feedback branch of a predistortion system, a direct current component of a varying magnitude, i.e. DC-offset, occurs owing to the carrier wave leakage of an I/Q modulator in the forward branch. An I/Q modulator operates on a quadrature modulation basis. It enables two independent signals to be combined in the transmitter and be transmitted on the same transmission band and the signals to be separated again at the receiver. The principle of quadrature modulation is that two separate signals, I and Q (Inphase and Quadrature phase), are modulated by using the same carrier wave frequency, but the phases of the carrier waves differ from each other in that the carrier wave of signal Q lags 90° the carrier wave of signal I. After modulation, the signals are summed. Thanks to the phase difference, the I- and Q-signals can be separated from each other when the sum signal is demodulated. Due to the DC-component, it is difficult to measure and compensate for the nonlinearity of the amplifier; therefore, the DC-component is to be removed. Correction circuits with fixed correction parameters set therein have been used in connection with predistortion systems for correcting the DC-offset caused by the I/Q modulator. The problem is then manufacturability since each I/Q modulator requires unique parameters which must be set as early as during the production. Furthermore, the carrier wave leakage does not stay constant but creeps with time. Consequently, the fixedly-set correction does not work properly in the long run. Another known solution has been disclosed in "New Methods for Adaptation of Quadrature Modulators and Demodulators in Amplifier Linearization Circuits" by Cavers, J. K. in IEEE Transactions on Vehicular Technology, Vol. 46, No. 3, August 1997, pp. 707 to 716. It discloses a system wherein the correction parameters are determined by comparing the output of an I/Q modulator with the input thereof. The solution requires, however, an additional feedback branch independent of the feedback branch of the predistorter, which results in a complex arrangement.

BRIEF DESCRIPTION OF THE INVENTION

An object of the invention is thus to provide a method and an arrangement implementing the method such that the above-mentioned problems can be solved. The objects of the invention are achieved by a method of determining correction parameters used for correcting DC-offset of an I/Q modulator in a transmitter, which transmitter comprises an I/Q modulator for I/Q-modulating a signal to be transmitted and a corrector for correcting the DC-offset caused by the I/Q modulator according to the correction parameters, which method comprises the steps of feeding I/Q-plane test vectors being comprised of I- and Q-test signals into the transmitter, and sampling the I/Q-modulated test signals to be transmitted, the method being characterized by further comprising the steps of A/D-converting the signal samples taken from the test signals to be transmitted, I/Q-demodulating the signal samples digitally into I- and Q-feedback signals, determining the DC-offset caused by the I/Q modulator on the basis of the test vectors and the feedback vectors caused by the test vectors and being comprised of the I- and Q-feedback signals, and determining the correction parameters of the DC-offset on the basis of the determined DC-offset.

The invention is based on the idea that the I/Q demodulation of the feedback signal is carried out digitally, whereby the I/Q demodulation does not cause DC-offset to the signal. The DC-offset caused by the I/Q modulator, and thus the correction parameters of the correcting circuit, can then be determined by means of the feedback signals since the feedback signals comprise DC-offset caused by the I/Q modulator only. An advantage of the method of the invention is that the feedback arrangement is simple. Furthermore, the same feedback branch can be used for determining the parameters of the corrector of the DC-offset of the I/Q modulator. This considerably simplifies the structure of the predistortion system of the transmitter and, as fewer components are needed, also saves costs.

The invention further relates to an arrangement for determining correction parameters used for correcting DC-offset of an I/Q modulator in a transmitter, which transmitter comprises an I/Q modulator for I/Q-modulating a signal to be transmitted and a corrector for correcting the DC-offset caused by the I/Q modulator according to the correction parameters, which arrangement comprises means for sampling the I/Q-modulated test signals to be transmitted, which are formed from I/Q-plane test vectors being comprised of I- and Q-test signals fed into the transmitter, the arrangement being characterized by further comprising means for A/D-converting the signal samples taken from the test signals to be transmitted, means for I/Q-demodulating the signal samples digitally into I- and Q-feedback signals, means for determining the DC-offset caused by the I/Q modulator on the basis of the test vectors and the feedback vectors caused by the test vectors and being comprised of the I- and Q-feedback signals, and means for determining the correction parameters of DC-offset on the basis of the determined DC-offset. Such an arrangement enables the advantages of the method of the invention to be achieved by a simple structure.

Preferred embodiments of the invention are disclosed in the dependent claims.

BRIEF DESCRIPTION OF THE DRAWINGS

The invention is now described in closer detail in connection with the preferred embodiments and with reference to the accompanying drawings, in which.

DETAILED DESCRIPTION OF THE INVENTION

Figure 1:
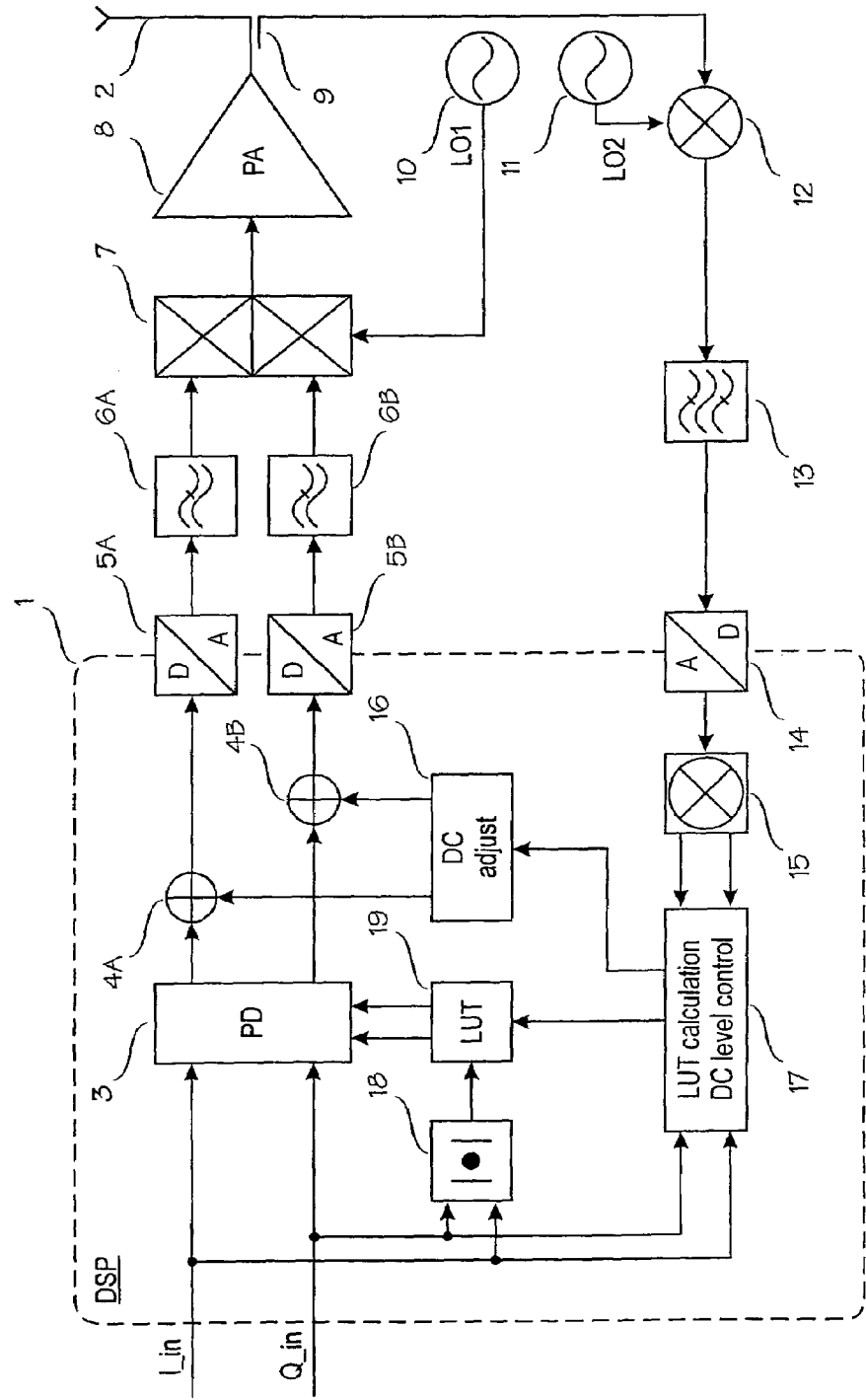
FIG. 1 is a block diagram of a transmitter of the invention according to a preferred embodiment thereof.

FIG. 1 is a block diagram of a transmitter of the invention according to a preferred embodiment thereof. It is to be noted that the figure shows only elements relevant for the invention to be understood. In the figure, I- and Q-signals I_IN and Q_IN to be transmitted are supplied to the transmitter. Predistortion carried out to cancel the nonlinearity of an amplifier 8 as well as correction of the phase and amplitude imbalance caused by an I/Q modulator 7 are implemented by a digital signal processor (DSP) 1. Predistortion and correction could also be implemented by e.g. an ASIC (Application-Specific Integrated Circuit) circuit; this, however, is irrelevant as far as the basic idea of the invention is concerned. Predistortion is carried out at a predistorter 3 according to correction parameters obtained from a lookup table 19. The predistorted signals are corrected at correcting units 4A and 4B of the I/Q modulator in order to compensate for the DC-offset caused by the I/Q modulator 7. The correcting units 4A and 4B add to the I- and Q-signals the DC-components obtained from a control unit 16, which cancel the DC-offset caused by the I/Q modulator 7. D/A converters 5A and 5B D/A-convert the signals obtained from the correcting means 4A and 4B into analogue signals, which are also preferably filtered by low-pass reconstruction filters 6A and 6B. These signals are further supplied to the I/Q modulator 7. The I/Q modulator 7 and an I/Q demodulator 15 operate on a quadrature modulation basis, which enables two independent signals to be combined at the transmitter and to be transmitted on the same transmission band, and the signal to be separated again at the receiver. The principle of quadrature modulation is that two separate signals, I and Q (Inphase and Quadrature phase), are modulated by using the same carrier wave frequency, but the phases of the carrier waves differ from each other in that the carrier wave of signal Q lags 90° the carrier wave of signal 1. After modulation, the signals are summed. Thanks to the phase difference, the signals I and Q can be separated from each other when the sum signal is demodulated. The signals are modulated and combined at the I/Q modulator 7. The I/Q modulator operates synchronized by a local oscillator 10. The I/Q-modulated signal is supplied to a power amplifier PA8 and further to an antenna 2 to be transmitted. Simultaneously, feedback is formed by means of a sampling arrangement 9, such as a directional coupler. The radio frequency (e.g. 400 MHz) feedback signal is down-mixed to an intermediate frequency of 450 kHz, for example, preferably by a down-mixer 12. Down-mixing is carried out synchronized by a local oscillator 11. The intermediate-frequency signal can, if necessary, be filtered by a broadband filter 13, and also attenuated. The intermediate-frequency signal is sampled by an A/D converter 14 for baseband (or intermediate frequency) processing. This is preferably carried out by using undersampling (sampling frequency 162 kHz, for example); this, however, is irrelevant as far as the basic idea of the invention is concerned. Undersampling means that the signal to be sampled is sampled at a lower frequency than the Nyquist frequency. As is known, undersampling can be used if the band of the signal to be sampled is sufficiently restricted. The advantage of using undersampling in the A/D conversion 14 is, for example, that less memory is needed in the conversion than in normal sampling (or oversampling). In addition, the use of undersampling does not usually require additional procedures since the band of the signal supplied to the A/D converter is typically already restricted. The band of the signal can be restricted, if necessary, by potential passband filtering 13.

The I/Q demodulator 15 is implemented by a digital signal processor 1 (or by an ASIC circuit, for example). The A/D-converted intermediate-frequency feedback signal is I/Q-demodulated by digitally multiplying into baseband I- and Q-feedback signals by the I/Q demodulator 15. The I/Q demodulator is thus implemented by software at the digital signal processor 1. The digitally implemented I/Q demodulator 15 does not cause distortions to the signal, as an analogue I/Q demodulator would. The baseband I- and Q-feedback signals are conveyed to a computing unit 17 wherein the predistortion table 19 is generated. The manner in which the predistortion table 19 is generated is irrelevant to the invention. The computing unit 17 also receives signals I_IN and Q_IN supplied to the transmitter to be transmitted. The actual predistortion is carried out by means of the predistortion table 19. At a unit 18, an absolute value, i.e. the amplitude of the signal, is determined from a complex signal comprising signals I_IN and Q_IN. This amplitude data is fed to the amplitude predistortion table 19, which, on the basis of the amplitude data, gives the corresponding correction parameters to the predistorter 3. Being irrelevant to the basic idea of the invention, the predistortion method used may differ from the method disclosed above.

Figure 2:
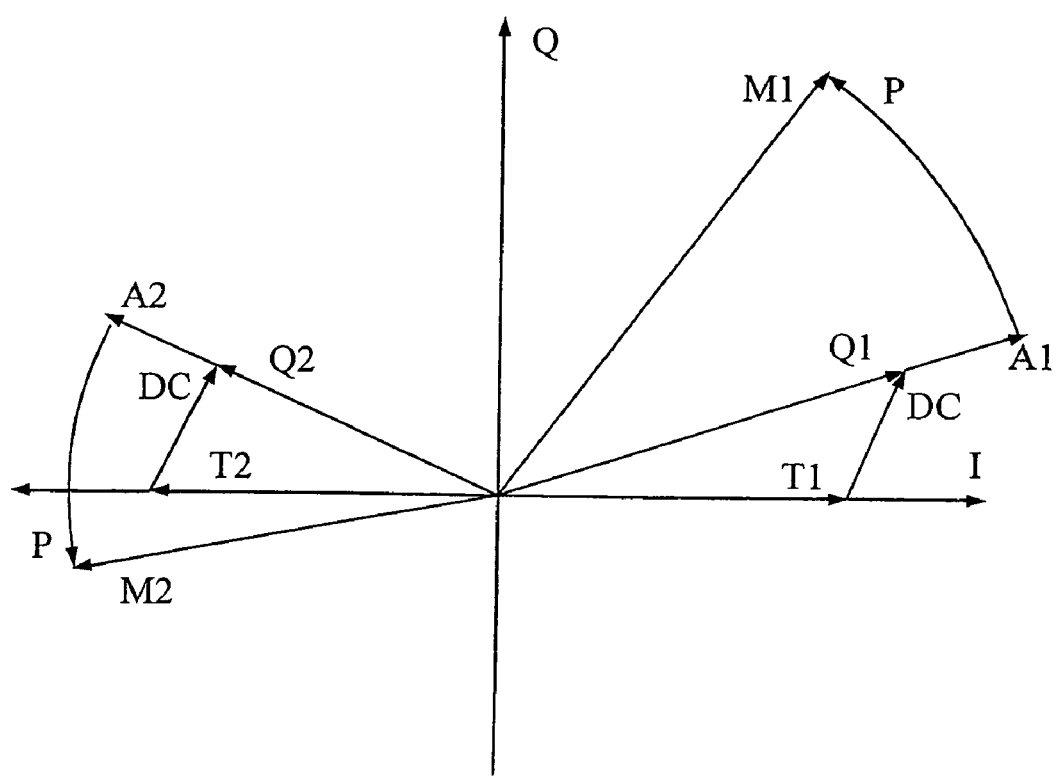
FIG. 2 shows, on an I/Q-plane, vectors used for determining DC-offset.

Regardless of how the above-described predistortion carried out to linearize the amplifier 8 has been implemented, the determination and correction according to the invention of the DC-offset caused by the I/Q modulator 7 is carried out in, for example, in the following manner: test vectors are fed into the transmitter. The test vectors are comprised of DC-signals fed into I- and Q- branches, whereby the I- and Q-components together form a complex signal, i.e. a test vector, on the I/Q-plane. The test vector can be formed such that, for example, a constant-level DC-signal is transmitted in the I-branch and a zero-level signal in the Q-branch, as illustrated in FIG. 2 by test vectors T1 and T2. Alternatively, a constant-level DC-signal could be fed to the Q-branch and a zero-level signal to the I-branch, or constant-level DC-signals differing from zero to both I- and Q-branches. According to the preferred embodiment of the invention, two test vectors T1 and T2 are used, the vectors being equal in their absolute value but opposite in their phases, i.e. T1=−T2. The amplifier 8 is then retained in the linear operation range, in which case it does not distort the test signal travelling therethrough. Furthermore, when the digital I/Q demodulation 15 is used, which, as was already stated above, does not cause distortions to the signal, the DC-offset DC determined from feedback vectors M1 and M2 being comprised of the I- and Q-feedback signals supplied to the computing unit 17 is caused by the I/Q modulator 7. The feedback vectors M1 and M2 caused by the test vectors T1 and T2 fed to the transmitter are determined at the computing unit 17. The I/Q modulator 7 adds a DC-level DC to the test vector T1 and T2, as is shown by FIG. 2. The test vectors travelled through the I/Q modulator are denoted by Q1 and Q2 (Q1=T1+DC and Q2=T2+DC). The amplifier 8 and the feedback branch further cause constant-value amplification A and phase angle change P to the test vectors. In FIG. 2, the amplified vectors Q1 and Q2 are denoted by A1 and A2. The phase angle change is denoted by P, whereby the feedback vectors M1 and M2 supplied to the computing unit 17 are obtained. The DC-offset DC caused by the I/Q modulator 7 can now, by means of the two test vectors T1 and T2 and the feedback vectors M1 and M2 generated thereby, be computed in the following manner:

The following equations can be written for the feedback vectors M1 and M2:

$$M1 = Ae^{iP}(T1+DC) \text{ and} \quad (1.1)$$

$$M2 = Ae^{iP}(T2+DC), \text{ where} \quad (1.2)$$

A=amplification caused by the amplifier 8 and the feedback branch e=Neper number i=imaginary unit P=change of phase angle caused by the amplifier 8 and the feedback branch T1 and T2=test vectors, and DC=DC-offset caused by the I/Q modulator 7.

The DC-offset is solved from equations 1.1 and 1.2:

$$DC = T(g+1)/(g-1), \text{ where} \quad (1.3)$$

T=T1=−T2 and g=M1/M2.

The DC-offset DC is a complex number, so the DC-components of I- and Q-branches can be separated therefrom. When the DC-offset DC has been determined at the computing unit 17, the I- and Q-components are determined and fed as correction parameters to a control unit 16. The control unit 16, in turn, feeds the DC-levels compensating for the DC-offset to the correcting units 4A and 4B according to the correction parameters fed thereto. Being irrelevant to the invention, the form of the correcting circuit 4A, 4B and 16 can deviate from the described one.

In the above-described measuring arrangement, the phase noise of the local oscillators 10 and 11 may limit the measuring accuracy of the DC-offset DC. Viewed on the I/Q-plane, this means that a noise component is added to the test vectors T1 and T2, which is perpendicular to the test vector, i.e. the length of the vector is constant but the phase angle oscillates in accordance with the noise. This problem can be avoided by using two test vector pairs: first, the DC-offset is measured, as described above, by using two test vectors with the same direction as the I-axis, as in FIG. 2. From the DC-offset thus determined, only the I-component is utilized since the Q-component is noisy. Next, the DC-offset is measured, as described above, by using two test vectors with the same direction as the Q-axis. From the DC-offset thus determined, only the Q-component is utilized correspondingly while the I-component is rejected. Hence, by means of the two test vector pairs, both I- and Q-components of the DC-offset can be determined, simultaneously eliminating the effect of the noise component on the measuring result.

The correction parameters of the DC-offset can be updated at certain predetermined intervals, for example, or in response to a parameter or to an external request when, for example, the frequency used or some such factor changes. The TETRA system comprises a special linearization time slot reserved for linearizing the transmitter. Hence, in the TETRA system, it is during the linearization time slot when the correction parameters of the I/Q modulator 7 can be preferably determined.

Although the use of the invention has been described herein mostly in connection with the TETRA system, there are no restrictions to the use of the invention in systems of other type as well. The structure of the transmitter used may differ from the described one while the basic idea of the invention remains the same. It is obvious to those skilled in the art that the basic idea of the invention can be implemented in many ways as technology progresses. The invention and the embodiments thereof are thus not restricted to the examples described above but they can vary within the scope of the claims.

What is claimed is:

1. A method of determining correction parameters used for correcting DC-offset of an I/Q (Inphase/Quadrature phase) modulator in a transmitter, which transmitter comprises an I/Q modulator for I/Q-modulating a signal to be transmitted and a corrector for correcting the DC-offset caused by the I/Q modulator according to the correction parameters, the method comprising the steps of:

feeding I/Q-plane test vectors being comprised of I- and Q-test signals into the transmitter;

sampling the I/Q-modulated test signals to be transmitted;

A/D-converting the signal samples taken from the test signals to be transmitted;

I/Q-demodulating the signal samples digitally into I- and Q-feedback signals;

determining the DC-offset caused by the I/Q modulator on the basis of the test vectors and the feedback vectors caused by the test vectors and being comprised of the I- and Q-feedback signals; and determining the correction parameters of the DC-offset on the basis of the determined DC-offset.

2. A method as claimed in claim 1, wherein the determination of the correction parameters is performed at predetermined intervals.

3. A method as claimed in claim 1, wherein the determination of the correction parameters is performed during a linearization time slot.

4. A method as claimed in claim 1, wherein the I- and Q-test signals are positive or negative DC-signals, and one of the signals can have a value zero.

5. A method as claimed in claim 4, wherein the number of the test vectors is two, whereby the test vectors have equal absolute values and opposite phases.

6. A method as claimed in claim 5, wherein the determination of the DC-offset is performed by formula:

$$DC=T(g+1)/(g-1), \text{ where}$$

T=T1=−T2, when T1=test vector 1 and T2=test vector 2, and g=M1/M2, when M1=feedback vector 1 caused by test vector 1 and M2=feedback vector 2 caused by test vector 2.

7. A method as claimed in claim 5 or 6, wherein the determination of the DC-offset is performed twice such that in the first determination, test vectors having the same direction as the I-axis of the I/Q-plane are used, and in the second determination, test vectors having the same direction as the Q-axis of the I/Q-plane are used; and wherein the I-component of the DC-offset obtained in the first determination of the DC-offset and the Q-component of the DC-offset obtained in the second determination are used in the determination of the correction parameters.

8. An arrangement for determining correction parameters used for correcting DC-offset of an I/Q (Inphase/Quadrature phase) modulator in a transmitter, which transmitter comprises an I/Q modulator for I/Q-modulating a signal to be transmitted and a corrector for correcting the DC-offset caused by the I/Q modulator according to the correction parameters, the arrangement comprising:

sampling means for sampling the I/Q-modulated test signals to be transmitted, which are formed from I/Q-plane test vectors being comprised of I- and Q-test signals fed into the transmitter;

A/D conversion means for A/D-converting the signal samples taken from the test signals to be transmitted;

I/Q demodulation means for I/Q-demodulating the signal samples digitally into I- and Q-feedback signals;

means for determining the DC-offset caused by the I/Q modulator on the basis of the test vectors and the feedback vectors caused by the test vectors and being comprised of the I- and Q-feedback signals; and means for determining the correction parameters of DC-offset on the basis of the determined DC-offset.

9. An arrangement as claimed in claim 8, wherein the arrangement is arranged to determine the correction parameters at predetermined intervals.

10. An arrangement as claimed in claim 8, wherein the arrangement is arranged to determine the correction parameters during a linearization time slot.

11. An arrangement as claimed in claim 8, wherein the I- and Q-test signals are positive or negative DC-signals and one of the signals can have a value zero.

12. An arrangement as claimed in claim 11, wherein the number of the test vectors is two, and the test vectors have equal absolute values and opposite phases.

13. An arrangement as claimed in claim 12, wherein the arrangement is arranged to determine the DC-offset by the formula:

$$DC=T(g+1)/(g-1), \text{ where}$$

T=T1=−T2, when T1=test vector 1 and T2 =test vector 2, and g=M1/M2, when M1=feedback vector 1 caused by test vector 1 and M2=feedback vector 2 caused by test vector 2.

14. An arrangement as claimed in claim 12 or 13, wherein the arrangement is arranged to:

determine the DC-offset twice such that in the first determination, test vectors having the same direction as the I-axis of the I/Q-plane are used, and in the second determination, test vectors having the same direction as the Q-axis of the I/Q-plane are used; and use, in the determination of the correction parameters, the I-component of the DC-offset obtained in the first determination of the DC-offset and the Q-component of the DC-offset obtained in the second determination.

* * * * *